(12) United States Patent
Romanovskyy

(10) Patent No.: US 9,613,672 B2
(45) Date of Patent: *Apr. 4, 2017

(54) DIFFERENTIAL CURRENT SENSING SCHEME FOR MAGNETIC RANDOM ACCESS MEMORY

(71) Applicant: TAIWAN SEMICONDUCTOR MANUFACTURING COMPANY LTD., Hsinchu (TW)

(72) Inventor: Sergiy Romanovskyy, Ottawa (CA)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/987,503

(22) Filed: Jan. 4, 2016

(65) Prior Publication Data

US 2016/0118100 A1    Apr. 28, 2016

Related U.S. Application Data

(63) Continuation of application No. 14/611,572, filed on Feb. 2, 2015, which is a continuation of application No. 13/948,432, filed on Jul. 23, 2013, now Pat. No. 8,976,613.

(51) Int. Cl.
*G11C 7/02* (2006.01)
*G11C 11/16* (2006.01)
*G11C 7/06* (2006.01)
*G11C 11/4091* (2006.01)

(Continued)

(52) U.S. Cl.
CPC .......... *G11C 11/1673* (2013.01); *G11C 7/062* (2013.01); *G11C 7/065* (2013.01); *G11C 7/14* (2013.01); *G11C 11/22* (2013.01); *G11C 11/4091* (2013.01); *G11C 2207/063* (2013.01)

(58) Field of Classification Search
CPC ......... G11C 7/062; G11C 7/065; G11C 11/22; G11C 11/4091; G11C 2207/063; G11C 5/02; G11C 13/003; G11C 11/4094; G11C 11/4097; G11C 8/10
USPC ..... 365/205, 206, 207, 189.07, 189.09, 145, 365/163, 210.1
See application file for complete search history.

(56) References Cited

U.S. PATENT DOCUMENTS 6,946,882 B2 * 9/2005 Gogl ..................... G11C 7/067
327/53
7,113,437 B2 * 9/2006 Schweickert .......... G11C 7/062
365/145

(Continued)

*Primary Examiner* — Gene Auduong
(74) *Attorney, Agent, or Firm* — WPAT, P.C., Intellectual Property Attorneys; Anthony King

(57) ABSTRACT

A circuit includes first and second reference cells and a current sense amplifier. The first and second reference cells are configured to store opposite logic values, respectively. The current sense amplifier is configured with a first node and a second node for currents therethrough to be compared with each other. The current sense amplifier includes a multiplexer configured to couple the first reference cell or the second reference cell to the first node of the current sense amplifier, and couple the second reference cell or the first reference cell to the second node of the current sense amplifier for reading bits stored in the first reference cell and the second reference cell.

20 Claims, 7 Drawing Sheets

(51) Int. Cl.
*G11C 11/22* (2006.01)
*G11C 7/14* (2006.01)

(56) References Cited

U.S. PATENT DOCUMENTS

| | | | |
|---|---|---|---|
| 8,976,613 B2* | 3/2015 | Romanovskyy | G11C 7/14 |
| | | | 365/189.07 |
| 9,230,631 B2* | 1/2016 | Romanovskyy | G11C 7/14 |
| 2006/0092689 A1* | 5/2006 | Braun | G11C 7/067 |
| | | | 365/158 |
| 2015/0146483 A1* | 5/2015 | Romanovskyy | G11C 7/14 |
| | | | 365/158 |

* cited by examiner

DIFFERENTIAL CURRENT SENSING SCHEME FOR MAGNETIC RANDOM ACCESS MEMORY

PRIORITY CLAIM AND CROSS-REFERENCE

This application is a continuation application of U.S. application Ser. No. 14/611,572 filed on Feb. 2, 2015, which is a continuation application of U.S. application Ser. No. 13/948,432 filed on Jul. 23, 2013, the disclosure of which is hereby incorporated by reference in its entirety.

TECHNICAL FIELD

The present disclosure is generally related to magnetic random access memory (MRAM) devices and, in particular, to a current sensing scheme for the MRAM devices.

BACKGROUND

In magnetic random access memories (MRAMs), memory cells are arranged in arrays having rows and columns. In some approaches, with reference to an accessed memory cell selected from a row and a column, a sense amplifier is used to compare a current flowing through the accessed memory cell against a reference current. Ideally, the value of the reference current is averaged between the currents when the accessed memory cell has corresponding high and low logic values. To that end, two reference cells are used, one having a low logic value, and one having a high logic value.

Effectively, the sense amplifier receives one accessed memory cell at one input and two reference cells at another input, and is therefore not symmetrical. As a result, the sense amplifier experiences unbalanced parasitic decoupling during a transition period after the sense amplifier is turned on, which, in turns, requires a long wait time for the currents at the two inputs of the sense amplifier to be stabilized. Further, the capacitive loads at the two inputs of the sense amplifier are not equal, and cause inaccuracies in fast dynamic sensing when instantaneous current difference is detected and amplified.

At high temperature such as 85° C., non-selected cells in two columns containing the reference cells have twice higher leakage current than non-selected cells in a regular column containing an accessed memory cell. As a result, a higher leakage current in the reference columns favors sensing a high logic value and contributes an error when sensing a low logic value.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
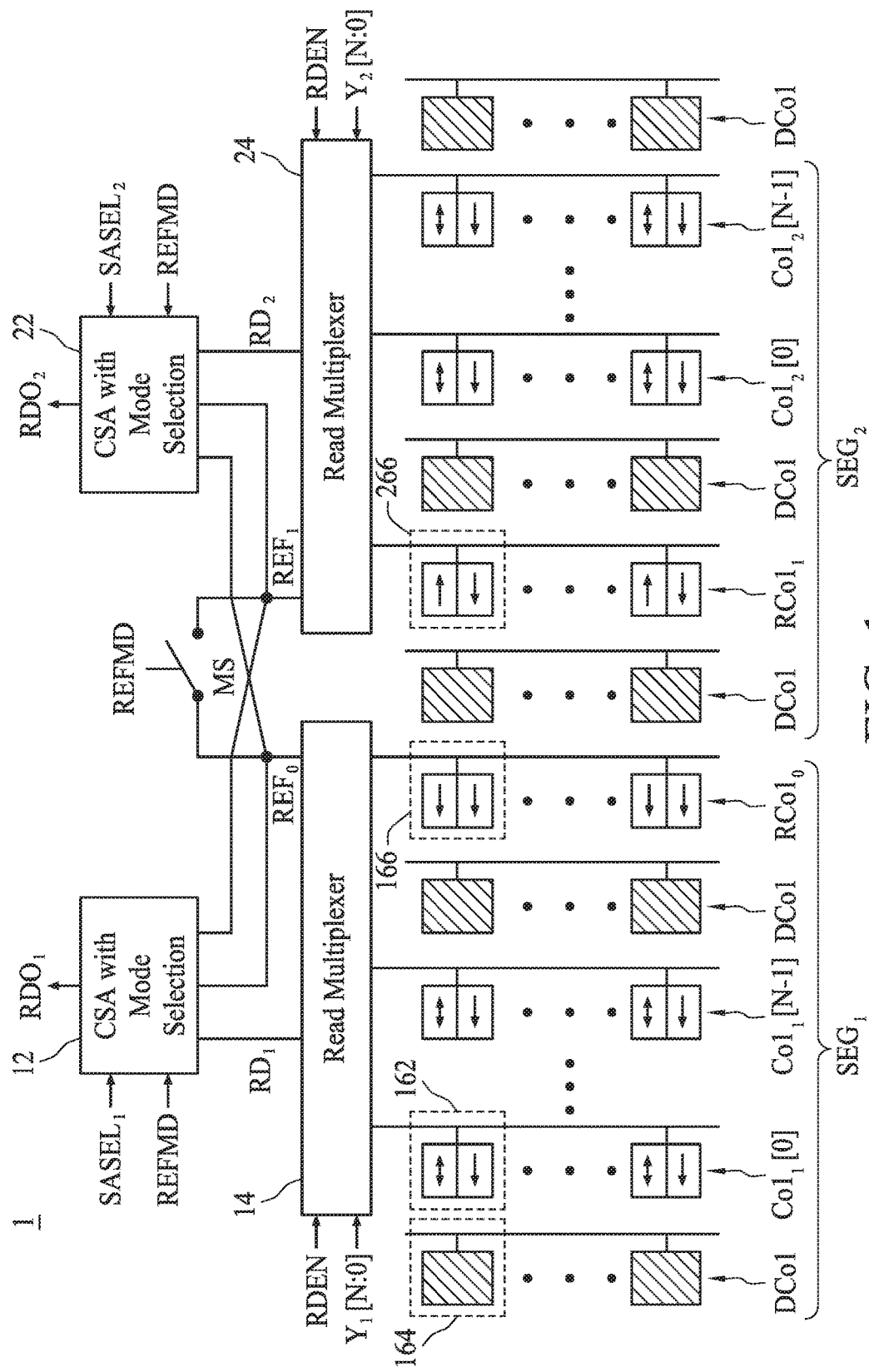
FIG. 1 is a schematic circuit diagram of a circuit for performing a differential current sensing scheme for an MRAM array in accordance with some embodiments.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when an element is referred to as being "connected to" or "coupled to" another element, it may be directly connected to or coupled to the other element, or intervening elements may be present.

In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

Circuit for Differential Current Sensing Scheme for MRAM

FIG. 1 is a schematic circuit diagram of a circuit 1 for a differential current sensing scheme for an MRAM array in accordance with some embodiments. FIG. 1 shows an overall structure for the differential current sensing scheme. In FIG. 1, the circuit 1 includes an MRAM array including array segments $SEG_1$ and $SEG_2$, read multiplexers 14 and 24 for the array segments $SEG_1$ and $SEG_2$, respectively, current sense amplifiers (CSAs) with mode selection 12 and 22 for the array segments $SEG_1$ and $SEG_2$, respectively, and an intermediate switch MS between the two array segments $SEG_1$ and $SEG_2$.

Figure 2:
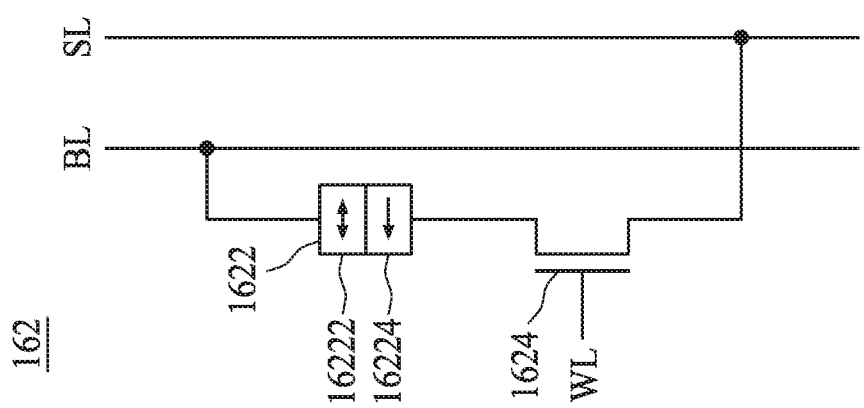
FIG. 2 is a schematic circuit diagram of a regular cell for storing a bit of data in accordance with some embodiments.

The array segment $SEG_1$ includes N regular columns $Col_1[0]$ to $Col_1[N-1]$, a reference column $RCol_0$, and a plurality of dummy columns DCol. The regular columns $Col_1[0]$ to $Col_1[N-1]$ include a plurality of rows of regular cell segments, and each regular cell segment includes a plurality of regular cells 162 for storing data. FIG. 2 is a schematic circuit diagram illustrating a regular cell 162 for storing a bit of data in accordance with some embodiments. The regular cell 162 includes an MTJ element 1622 and a pass gate 1624. In a standard configuration as shown, a free layer 16222 of the MTJ element 1622 is coupled to a bit line BL of a regular column containing the regular cell 162, a fixed layer 16224 of the MTJ element 1622 is coupled to one of a source and a drain of the pass gate 1624. The other of the source and drain of the pass gate 1624 is coupled to a sense line SL of the regular column containing the regular cell 162. A double arrow in the free layer 16222 is used to represent that a magnetization vector of the free layer 16222 can be parallel or anti-parallel to that of a fixed layer 16224, which is represented by a single arrow, depending on a logic value of the bit stored. Alternatively, in a reverse configuration, the free layer 16222 is coupled to one of a source and a drain of the pass gate 1624 and the fixed layer 16224 is coupled to the bit line BL of the regular cell 162. The rest of the configuration stays the same. The pass gate 1624 is controlled by a word line WL coupled with a gate of the pass gate 1624 for selecting a row of the array segment $SEG_1$. For simplicity, in FIG. 1, a bit line BL and a source line SL, described with reference to FIG. 2, of a regular column $Col_1[0]$, . . . , or $Col_1[N-1]$ are represented by a line connecting the regular cells in the corresponding column and the read multiplexer 14. Further, a regular cell 162 of the regular column $Col_1[0]$, . . . , or $Col[N-1]$ is represented by an MTJ element 1622. The MTJ element 1622 indicates whether a cell is a regular cell, a reference cell or a dummy cell. The reference column $RCol_0$ includes reference cells 166 similar to the regular cell 162 in FIG. 2. Each of the reference cells 166 stores the logic low value, as indicated by parallel magnetization vectors in the reference cell 166.

Symmetric to the array segment $SEG_1$, the array segment $SEG_2$ includes N regular columns $Col_2[0]$ to $Col_2[N-1]$, a reference column $RCol_1$, and a plurality of dummy columns DCol. The array segment $SEG_2$ is different from the array segment $SEG_1$ in that the reference column $RCol_1$ includes reference cells 266 each of which stores the logic high value, as represented by anti-parallel magnetization vectors in the reference cell 266. In some embodiments, reference columns have some cells with one logic value and the rest of the cells with an opposite logic value. In such embodiments, a reference cell in a selected row from the segment $SEG_1$ and a reference cell in a selected row from the segment $SEG_2$ have opposite logic values.

Figure 3:
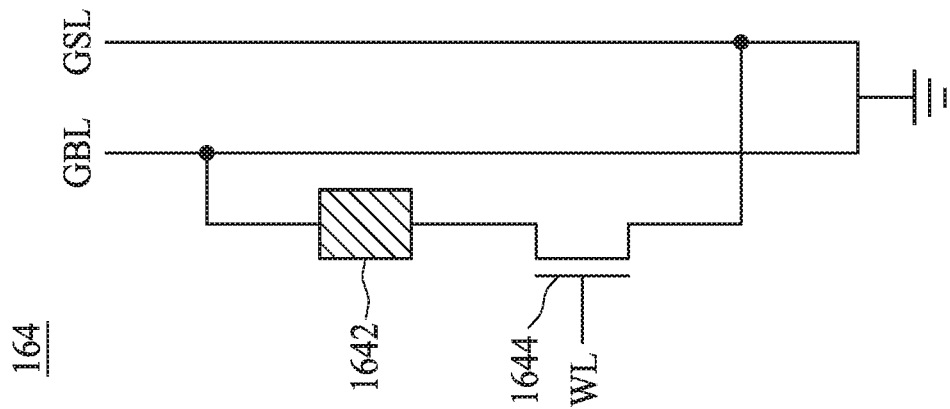
FIG. 3 is a schematic circuit diagram of a dummy cell in accordance with some embodiments.

Both the array segment $SEG_1$ and the array segment $SEG_2$ include dummy columns DCol. FIG. 3 is a schematic circuit diagram illustrating a dummy cell 164 in a dummy column DCol in FIG. 1 in accordance with some embodiments. The dummy cell 164 includes an MTJ element 1642 and a pass gate 1644. Similar to the regular cell 162 in FIG. 2, the MTJ element 1642 and the pass gate 1644 are connected in series. Further, two ends of the series-connected MTJ element 1642 and pass gate 1644 are coupled to a bit line GBL and a source line GSL of the dummy column DCol, respectively. The bit line GBL and the source line GSL are grounded. Therefore, no read or write operation is performed on the dummy cell 164, and the magnetization vectors of the MTJ element 1642 become irrelevant and are shaded. For simplicity, in FIG. 1, a bit line GBL and a source line GSL, described with reference to FIG. 3, of a dummy column DCol are represented by a line connecting the dummy cells in the corresponding dummy column without connecting to the read multiplexer 14, and a dummy cell 164 of the dummy column DCol is represented by a shaded MTJ element 1642.

In FIG. 1, the array segment $SEG_1$ is arranged to begin with a dummy column DCol, followed by the regular columns $Col_1[0]$ to $Col_1[N-1]$, another dummy column DCol, and then the reference column $RCol_0$. The array segment $SEG_1$ is followed by the array segment $SEG_2$ which is arranged to begin with a dummy column DCol, followed by the reference column $RCol_1$, another dummy column DCol, and then the regular columns $Col_2[0]$ to $Col_2[N-1]$.

The array segment $SEG_2$ is again be followed by another array segment (not shown) similar to the array segment $SEG_1$. Therefore, each of the regular column $Col_1[0]$ to $Col_1[N-1]$, reference column $RCol_0$, reference column $RCol_1$ and the regular column $Col_2[0]$ to $Col_2[N-1]$ is sandwiched between two of the dummy columns DCol, and are thereby shielded.

In each segment $SEG_1$ or $SEG_2$ during sensing, only one selected regular column $Col_1[i]$ or $Col_2[j]$ and the reference column $RCol_0$ or $RCol_1$ are active. Other non-selected regular columns $Col_1[0]$ to $Col_1[i-1]$ and $Col_1[i+1]$ to $Col_1[N-1]$ and other non-selected regular columns $Col_2[0]$ to $Col_2[j-1]$ and $Col_2[j+1]$ to $Col_2[N-1]$ stay at some potential, e.g., at ground in some embodiments. In order to keep dynamic capacitances for active columns that are not surrounded, and thus not shielded, by unselected columns, dummy columns DCol are used to shield the active columns, which include, a selected regular column $Col_1[i]$ in the regular columns $Col_1[0]$ to $Col_1[N-1]$, the reference column $RCol_0$, and a selected regular column $Col_2[j]$ in the regular columns $Col_2[0]$ to $Col_2[N-1]$. In some embodiments, if the selected regular column $Col_1[i]$ or $Col_2[j]$ is surrounded by unselected regular columns $Col_1[m-1]$ and $Col_1[i+1]$, or $Col_2[j-1]$ and $Col_2[j+1]$, the selected regular column $Col_1[i]$ or $Col_2[j]$ is shielded. If, however, the selected regular column $Col_1[i]$ or $Col_2[j]$ is not surrounded by unselected regular columns, a dummy column DCol is used in conjunction with the unselected regular column to surround the active column and thus shield the active column. In some embodiments as illustratively shown in FIG. 1, dummy columns DCol are inserted at where the active column is not surrounded by unselected columns during sensing, including, for example, column $Col_1[0]$, $Col_1[N-1]$, $RCol_0$, $RCol_1$, $Col_2[0]$ or $Col_2[N-1]$. For another example, a dummy column DCol is inserted between the reference columns $RCol_0$ and $RCol_1$, because both reference columns $RCol_0$ and $RCol_1$ are active at the same time. A dummy column DCol is inserted between the regular column $Col_1[N-1]$ and the reference column $RCol_0$, because both the regular columns $Col_1[N-1]$ and the reference column $RCol_0$ can be active at the same time. Further, a dummy column DCol is inserted between the regular column $Col_2[0]$ and the reference column $RCol_1$ because both the regular column $Col_2[0]$ and the reference column $RCol_1$ can be active at the same time The read multiplexer 14 receives the regular columns $Col_1[0]$ to $Col_1[N-1]$, the reference column $RCol_0$, the read enable signal RDEN, and a column address $Y_1[N:0]$ as inputs. In response to the read enable signal RDEN, the read multiplexer 14 selectively couples one of the regular columns $Col_1[0]$ to $Col_1[N-1]$ to a data output $RD_1$, and couples the reference column $RCol_0$ to a reference output $REF_0$ based on the column address $Y_1[N:0]$. Similarly, the read multiplexer 24 receives the regular columns $Col_2[0]$ to $Col_2[N-1]$, the reference column $RCol_1$, the read enable signal RDEN, and a column address $Y_2[N:0]$ as inputs. In response to the read enable signal RDEN, the read multiplexer 24 selectively couples one of the regular columns $Col_2[0]$ to $Col_2[N-1]$ to a data output $RD_2$, and couples the reference column $RCol_1$ to a reference output $REF_1$ based on the column address $Y_2[N:0]$.

The CSA with mode selection 12 has three inputs coupled to the data output $RD_1$ of the read multiplexer 14, the reference output $REF_0$ of the read multiplexer 14, and the reference output $REF_1$ of the read multiplexer 24, and generates an output $RDO_1$. Symmetrically, the CSA with mode selection 22 has three inputs coupled to the data output $RD_2$ of the read multiplexer 24, the reference output $REF_1$ of the read multiplexer 24, and the reference output $REF_0$ of the read multiplexer 14, and generates an output $RDO_2$. The CSAs 12 and 22 operate in two modes, a user mode and a reference cell mode. The user mode is for reading data bits stored in a regular cell in the array segment $SEG_1$ and a regular cell in the second array segment $SEG_2$, respectively. The reference cell mode is for checking reference bits stored in a reference cell in the reference column $RCol_0$ and a reference cell in the reference column $RCol_1$, respectively. The CSA 12 receives two control signals, a sense amplifier select signal $SASEL_1$ and a reference mode signal REFMD for the user mode and the reference cell mode. Similarly, the CSA 22 receives two control signals, a sense amplifier select signal $SASEL_2$ and the reference mode signal REFMD for the user mode and the reference cell mode. In the user mode, the signal REFMD is deasserted, and both signals $SASEL_1$ and $SASEL_2$ are asserted to select both the CSAs 12 and 22. In the reference cell mode, the signal REFMD is asserted, and one of the signals $SASEL_1$ and $SASEL_2$ is asserted to select one of the CSAs 12 and 22. Detailed operations of the user mode and the reference cell mode are discussed with reference to FIGS. 4 and 5, respectively.

The intermediate switch MS couples the reference output $REF_0$ of the read multiplexer 14 to the reference output $REF_1$ of the read multiplexer 24 if the reference mode signal REFMD is deasserted, and disconnects the reference output $REF_0$ of the read multiplexer 14 from the reference output $REF_1$ of the read multiplexer 24 if the reference mode signal REFMD is asserted. In some embodiments, the intermediate switch MS is not used.

Figure 4:
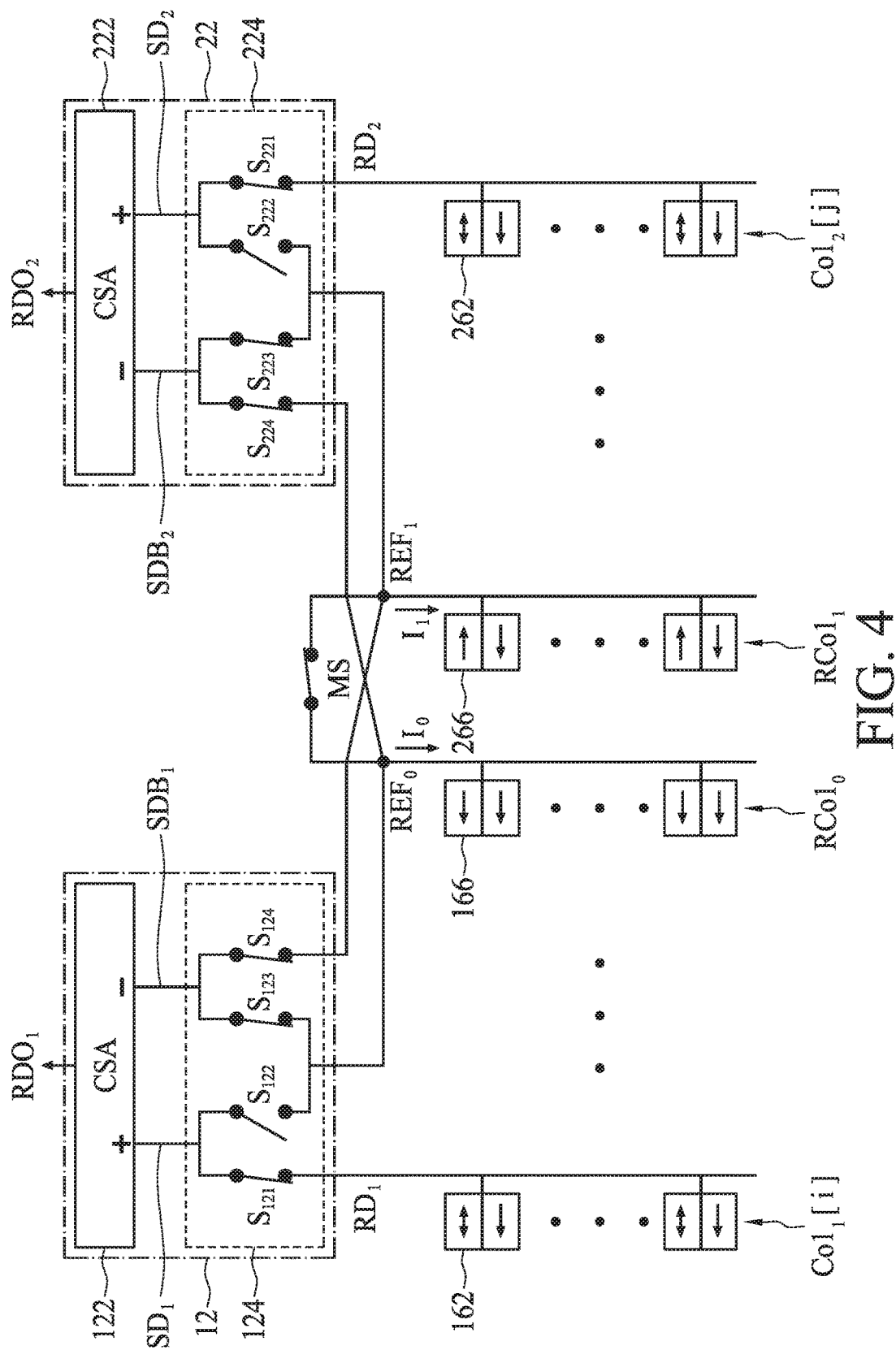
FIG. 4 is a schematic circuit diagram illustrating differential current sensing of the circuit in FIG. 1 under the user mode in accordance with some embodiments.

FIG. 4 is a schematic circuit diagram illustrating differential current sensing of the circuit 1 in FIG. 1 under the user mode, in accordance with some embodiments. In the user mode, the read multiplexer 14 in FIG. 1 couples a regular cell 162 of a selected regular column $Col_1[i]$ to the data output $RD_1$ of the read multiplexer 14, and couples a reference cell 166 of the reference column $RCol_0$ to the reference output $REF_0$ of the read multiplexer 14. For simplicity, in FIG. 4, the data output $RD_1$ and the reference output $REF_0$ are shown, but the read multiplexer 14 is not shown. Similarly, the read multiplexer 24 couples a regular cell 262 of a selected regular column $Col_2[j]$ to the data output $RD_2$ of the read multiplexer 24, and couples a reference cell 266 to the reference column $RCol_1$ to the reference output $REF_1$ of the second read multiplexer 24. For simplicity, in FIG. 4, the data output $RD_2$ and the reference output $REF_1$ are shown, but the read multiplexer 24 is not shown. In accordance with some embodiments, the selected regular cell 162 or 262 and the reference cell 166 or 266 are in the same row to compensate resistance of metal routing in columns. For illustration purposes, the cells in the first row are selected in each column. However, any row could be selected and/or different rows in different array segments could be selected. The data output $RD_1$ and the reference output $REF_0$ of the read multiplexer 14 and the reference output $REF_1$ of the read multiplexer 24 are coupled to the three inputs of the CSA 12, respectively. The data output $RD_2$ and the reference output $REF_1$ of the read multiplexer 24 and the reference output $REF_0$ of the read multiplexer 14 are coupled to the three inputs of the CSA 22, respectively.

The CSA 12 includes a CSA 122 and a mode multiplexer 124. The mode multiplexer 124 includes four switches $S_{121}$, $S_{122}$, $S_{123}$ and $S_{124}$. In the user mode, the switch $S_{121}$ connects the regular cell 162 in the selected regular column $Col_1[i]$ to a node $SD_1$ of the CSA 12, the switch $S_{122}$ disconnects the reference cell 166 in the reference column $RCol_0$ from the node $SD_1$, the switch $S_{123}$ connects the reference cell 166 in the reference column $RCol_0$ to a node $SDB_1$ of the CSA 12, and the switch $S_{124}$ connects the reference column $RCol_1$ to the node $SDB_1$. A first current flows through the node $SD_1$, the switch $S_{121}$, a switch $S_{142}$, ... or $S_{144}$ of the read multiplexer 14 in FIG. 6, the sense line SL in FIG. 2, the pass gate 1624, the MTJ element 1622 and the bit line BL of the regular cell 162, some other circuitry related to writing, and finally to ground VSS. A second current flows through the node $SDB_1$, the switch $S_{123}$, the switch $S_{146}$ in FIG. 6, a sense line, a pass gate, an MTJ element, and a bit line of the reference cell 166 in FIG. 1, some other circuitry related to writing and finally to ground VSS. The reference cell 166, the sense line, the pass gate, the MJT element, and the bit line of the reference cell 166 are similar to the cell 162, the sense line SL, the pass gate 1624, the MJT element 1622, and the bit line BL in FIG. 2, respectively. The CSA 122 compares the first current at the node $SD_1$ against the second current at the second node $SDB_1$ to generate the output $RDO_1$.

Symmetrically, the CSA 22 includes a CSA 222 and a mode multiplexer 224. The mode multiplexer 224 includes four switches $S_{221}$, $S_{222}$, $S_{223}$ and $S_{224}$. In the user mode, the switch $S_{221}$ connects the selected regular column $Col_2[j]$ to a node $SD_2$ of the CSA 22, the switch $S_{222}$ disconnects the reference column $RCol_1$ from the node $SD_2$, the switch $S_{223}$ connects the reference column $RCol_1$ to a node $SDB_2$ of the CSA 22, and the switch $S_{224}$ connects the reference column $RCol_0$ to the node $SDB_2$. Current flows from the node $SD_2$ and the node $SDB_2$ of the CSA 22 to ground VSS are similar to those of the CSA 12 discussed above, except components in the array segment $SEG_1$ in FIG. 1 are replaced by corresponding components in the array segment $SEG_2$. The CSA 222 compares the current at the node $SD_2$ against the current at the node $SDB_2$ to generate the output $RDO_2$.

In the user mode, the switch MS couples the reference column $RCol_0$ to the reference column $RCol_1$, thereby forming a common node between the reference columns $RCol_0$ and $RCol_1$. In some embodiments illustrated in FIG. 4, the switch MS is used because in the CSA 12, the switch $S_{123}$ and the switch $S_{124}$ couple both the reference columns $RCol_0$ and $RCol_1$ to the node $SDB_1$. Further, in the CSA 22, the switch $S_{223}$ and the switch $S_{224}$ couple both the reference columns $RCol_0$ and $RCol_1$ to the node $SDB_2$. The switch MS further ensures that a current at the common node is a summative current of a current flowing in the reference column $RCol_0$ corresponding to the logic low value and a current flowing in the second reference column $RCol_1$ corresponding to the logic high value.

In the user mode, two CSAs 122 and 222 are used to achieve differential current sensing for reading two data bits. Each of the CSAs 122 and 222 effectively has similar amount of currents flowing through the node $SD_1$ or $SD_2$ and the node $SDB_1$ or $SDB_2$. Because a current $I_0$ flowing through the reference cell 166 in the reference column $RCol_0$ and a current $I_1$ flowing through the reference cell 266 in the reference column $RCol_1$ are summed and are equally divided between the CSAs 122 and 222, the current flowing through the node $SDB_1$ or $SDB_2$ of the CSA 122 or 222 is $0.5(I_0+I_1)$. Therefore, a magnitude of the current flowing through the node $SDB_1$ or $SDB_2$ is similar to that of the current flowing through the node $SD_1$ or $SD_2$, which is equal to either $I_0$ or $I_1$ depending on the data bit stored in the regular cell 162 or 262. In contrast to asymmetrical magnitudes of currents that flow through two inputs of the current sense amplifier in other approaches, the currents flowing through the node $SD_1$ or $SD_2$ and the node $SDB_1$ or $SDB_2$ of the present disclosure is symmetrical in magnitude.

In the user mode, each of the CSAs 122 and 222 effectively has symmetrical capacitive loading to the node $SD_1$ or $SD_2$ and the node $SDB_1$ or $SDB_2$. Because the nodes $SDB_1$ and $SDB_2$ of both of the CSAs 122 and 222 are coupled to the two reference columns $RCol_0$ and $RCol_1$, an effective capacitive loading to the node $SDB_1$ or $SDB_2$ of the CSA 122 or 222 is that of one column. Compared to a capacitive loading to the node $SD_1$ or $SD_2$ of the CSA 122 or 222, which is that of one regular column $Col_1[i]$ or $Col_2[j]$, the effective capacitive loading to the second node $SDB_1$ or $SDB_2$ is also that of one column, and is therefore symmetrical.

In the user mode, each of the CSAs 122 and 222 effectively has symmetrical leakage currents with respect to the node $SD_1$ or $SD_2$, and the node $SDB_1$ or $SDB_2$. Because the nodes $SDB_1$ and $SDB_2$ of both the CSAs 122 and 222 are coupled to the two reference columns $RCol_0$ and $RCol_1$, the leakage currents from the unselected cells in the two reference columns $RCol_0$ and $RCol_1$ are summed and are equally divided between the two nodes $SDB_1$ and $SDB_2$. Therefore, each of the node $SDB_1$ or $SDB_2$ is effectively experiencing the leakage current of one column. Compared to a leakage current flowing through the node $SD_1$ or $SD_2$, which is the leakage current of one regular column $Col_1[i]$ or $Col_2[j]$, the effective leakage current through the second node $SDB_1$ or $SDB_2$ is also one column and is therefore symmetrical. Because of comparable current magnitudes and symmetrical capacitive loading for the node $SD_1$ or $SD_2$ and the node $SDB_1$ or $SDB_2$, accuracy and noise immunity of differential current sensing are improved and dynamic sensing becomes possible with embodiments of the present disclosure.

Figure 5:
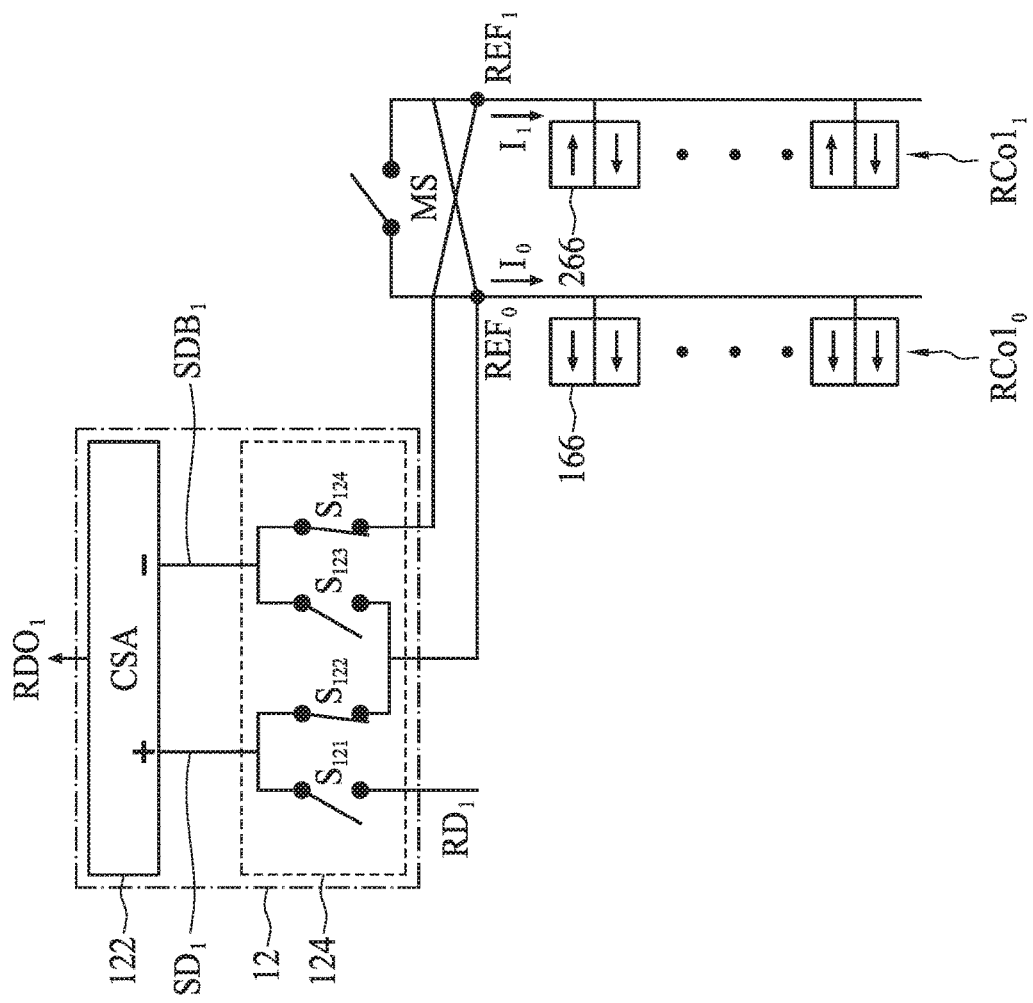
FIG. 5 is a schematic circuit diagram illustrating differential current sensing of the circuit in FIG. 1 under the reference cell mode in accordance with some embodiments.

FIG. 5 is a schematic circuit diagram illustrating differential current sensing of the circuit 1 in FIG. 1 under the reference cell mode in accordance with some embodiments. In the reference cell mode, the read multiplexer 14 in FIG. 1 couples a reference cell 166 of the reference column $RCol_0$ to the reference output $REF_0$ of the read multiplexer 14. Further, the read multiplexer 24 couples a reference cell 266 of the reference column $RCol_1$ to the reference output $REF_1$ of the read multiplexer 24. For illustration purposes, the cells in the first row are selected in each column. However, any row could be selected and/or different rows in different array segments could be selected. The reference output $REF_0$ of the read multiplexer 14 and the reference output $REF_1$ of the read multiplexer 24 are coupled to two of the three inputs of the CSA 12. As an example, the CSA 12 is selected. Either the CSA 12 or the CSA 22 can be selected in the reference cell mode.

In the multiplexer 124, the switch $S_{121}$ disconnects the data output $RD_1$ of the read multiplexer 14 in FIG. 1 from the node $SD_1$, the switch $S_{122}$ connects the reference cell 166 in the reference column $RCol_0$ to the node $SD_1$, the switch $S_{123}$ disconnects the reference cell 166 in the reference column $RCol_0$ from the node $SDB_1$ and the switch $S_{124}$ connects the reference cell 266 in the reference column $RCol_1$ to the node $SDB_1$. Current flows from the node $SD_1$ and the node $SDB_1$ of the CSA 12 to ground VSS are similar to those in the user mode, except the regular cell 162 is replaced by the reference cell 166 in the reference column $RCol_0$ and the reference cell 166 in the reference column $RCol_0$ is replaced by the reference cell 266 in the reference column $RCol_1$. The CSA 122 compares the current at the node $SD_1$ against the current at the node $SDB_1$ to generate the output $RDO_1$.

In the reference cell mode, the switch MS disconnects the reference column $RCol_0$ from the reference column $RCol_1$, thereby breaking the common node between the reference columns $RCol_0$ and $RCol_1$.

Further, one CSA 122 is used to achieve differential current sensing for checking reference bits in the reference cells of two reference columns $RCol_0$ and $RCol_1$. A current $I_0$ flowing through the reference cell 166 in the reference column $RCol_0$ and the node $SD_1$ of the CSA 122 is similar in magnitude to the current $I_1$ flowing through the reference cell 266 in the reference column $RCol_0$ and the node $SDB_1$ of the CSA 122. Also, a capacitive loading to the node $SD_1$ is that of one reference column $RCol_0$ and a capacitive loading to the node $SDB_1$ is that of one reference column $RCol_1$. Therefore, the capacitive loading to the two nodes $SD_1$ and $SDB_1$ are symmetrical. Furthermore, a leakage current flowing through the node $SD_1$ flows from one reference column $RCol_0$ and a leakage current flowing through the node $SDB_1$ flows from one reference column $RCol_1$. Hence, the leakage currents flowing through the two nodes $SD_1$ and $SDB_1$ are symmetrical. Because of comparable current magnitudes and symmetric capacitive loading for the node $SD_1$ and the node $SDB_1$, accuracy and noise immunity of differential current sensing are improved.

Figure 6:
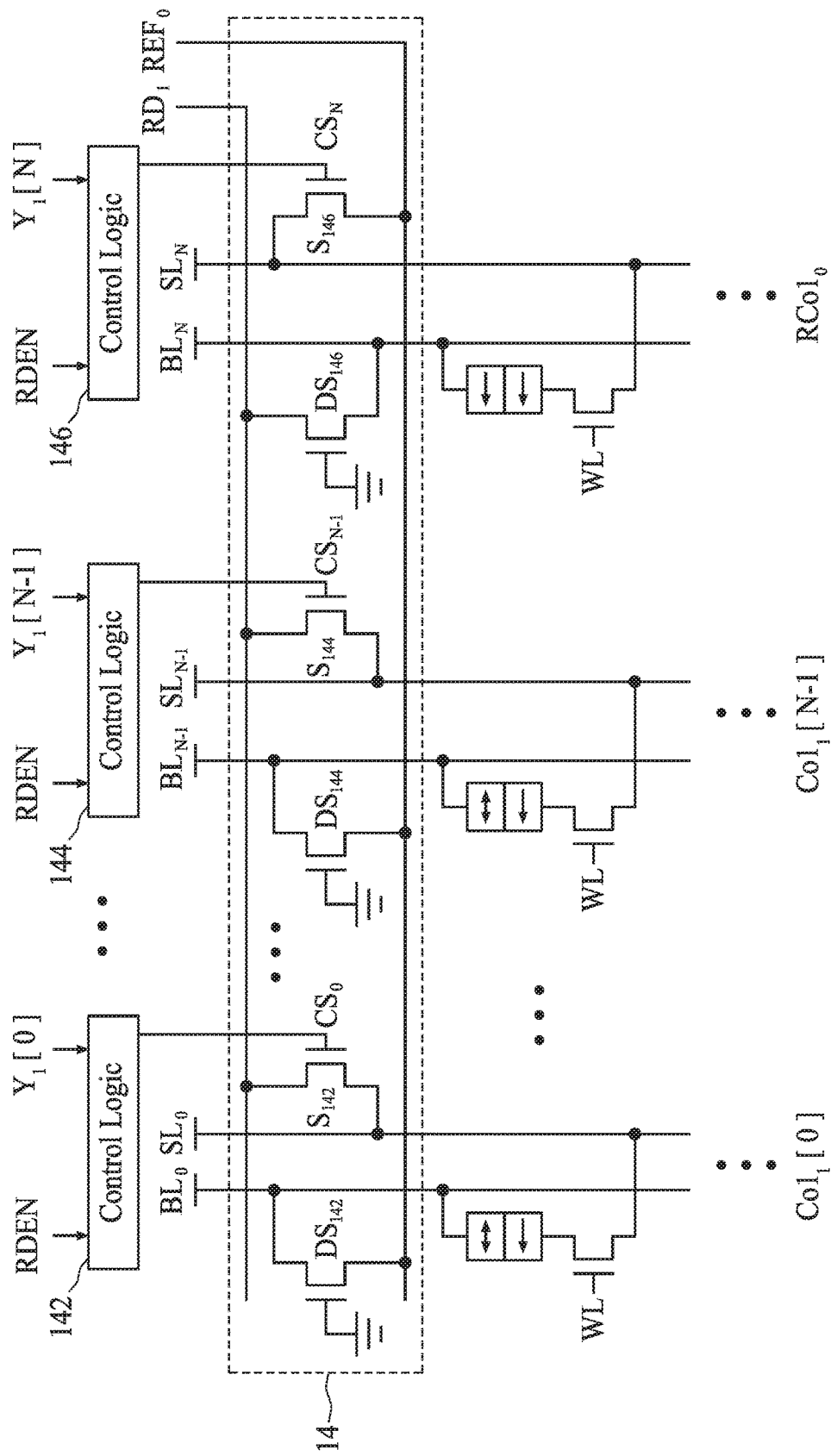
FIG. 6 is a schematic circuit diagram of the read multiplexer and associated circuits in accordance with some embodiments.

FIG. 6 is a schematic circuit diagram illustrating the read multiplexer 14 in FIG. 1 and associated circuits, in accordance with some embodiments. For illustration purposes, the read multiplexer 14 is shown. The same structure applies to the read multiplexer 24. The read multiplexer 14 includes a plurality of switches $S_{142}$ to $S_{144}$ corresponding to the regular columns $Col_1[0]$ to $Col_1[N-1]$, respectively. The switches $S_{142}$ to $S_{144}$ are configured to selectively couple one of the regular columns $Col_1[0]$ to $Col_1[N-1]$ to the data output $RD_1$ of the read multiplexer 14 in response to a corresponding control signals $CS_0$ to $CS_{N-1}$. The read multiplexer 14 further includes an additional switch $S_{146}$ corresponding to the reference column $RCol_0$ in FIG. 1. The switch $S_{146}$ is configured to selectively couple the reference column $RCol_0$ to the reference output $REF_0$ of the read multiplexer 14 in response to a control signal $CS_N$. In some embodiments, the switch $S_{146}$ is not used, and the reference column $RCol_0$ is directly coupled to the reference output $REF_0$. However, the switch $S_{146}$ is used in FIG. 6 to help in maintaining symmetry with respect to the outputs $RD_1$ and $REF_0$. In response to the read enable signal RDEN, the control signals $CS_0$ to $CS_N$ are provided by control logic blocks 142 to 144 based on the column address $Y_1[N:0]$.

Because the switches $S_{142}$ to $S_{144}$ for the regular columns $Col_1[0]$ to $Col_1[N-1]$ are coupled to the data output $RD_1$ and the switch $S_{146}$ for the reference column $RCol_0$ is coupled to the reference output $REF_0$, capacitive loading to the data output $RD_1$ and the reference output $REF_0$ are imbalanced. Since the data output $RD_1$ and the reference output $REF_0$ are coupled to the node $SD_1$ and the node $SDB_1$ of the CSA 122 in FIG. 4 in the user mode, maintaining balance between the two outputs $RD_1$ and $REF_0$ helps in improving sensing accuracy and immunity to noise. In order to balance the loading of the switches $S_{142}$ to $S_{144}$ to the data output $RD_1$, a plurality of dummy switches $DS_{142}$ to $DS_{144}$ coupling to the reference output $REF_0$ and corresponding to the switches $S_{142}$ to $S_{144}$ are introduced. Similarly, in order to balance the loading of the switch $S_{146}$ to the reference output $REF_0$, a dummy switch $DS_{146}$ coupling to the data output $RD_1$ and corresponding to the switch $S_{146}$ is introduced. The dummy switches $DS_{142}$ to $DS_{146}$ are maintained in a turned off state.

In some embodiments where an NMOS transistor is used as a dummy switch $S_{146}$, the gate of the NMOS transistor is grounded.

In accordance with some embodiments, the switches $S_{142}$ to $S_{146}$ are coupled to the sense lines $SL_0$ to $SL_{N-1}$ of the regular columns $Col_1[0]$ to $Col_1[N-1]$ and the sense line $SL_N$ of the reference column $RCol_0$, respectively. Further, the dummy switches $DS_{142}$ to $DS_{146}$ are coupled to the bit lines $BL_0$ to $BL_{N-1}$ of the regular columns $Col_1[0]$ to $Col_1[N-1]$ and the bit line $BL_N$ of the reference column $RCol_0$, respectively. In some embodiments, the dummy switches $DS_{142}$ to $DS_{146}$ are not coupled to the bit lines $BL_0$ to $BL_{N-1}$. However coupling the dummy switches $DS_{142}$ to $DS_{146}$ to bit lines $BL_0$ to $BL_{N-1}$ simplifies building equivalent load for the data output $RD_1$ and the reference output $REF_0$.

Figure 7:
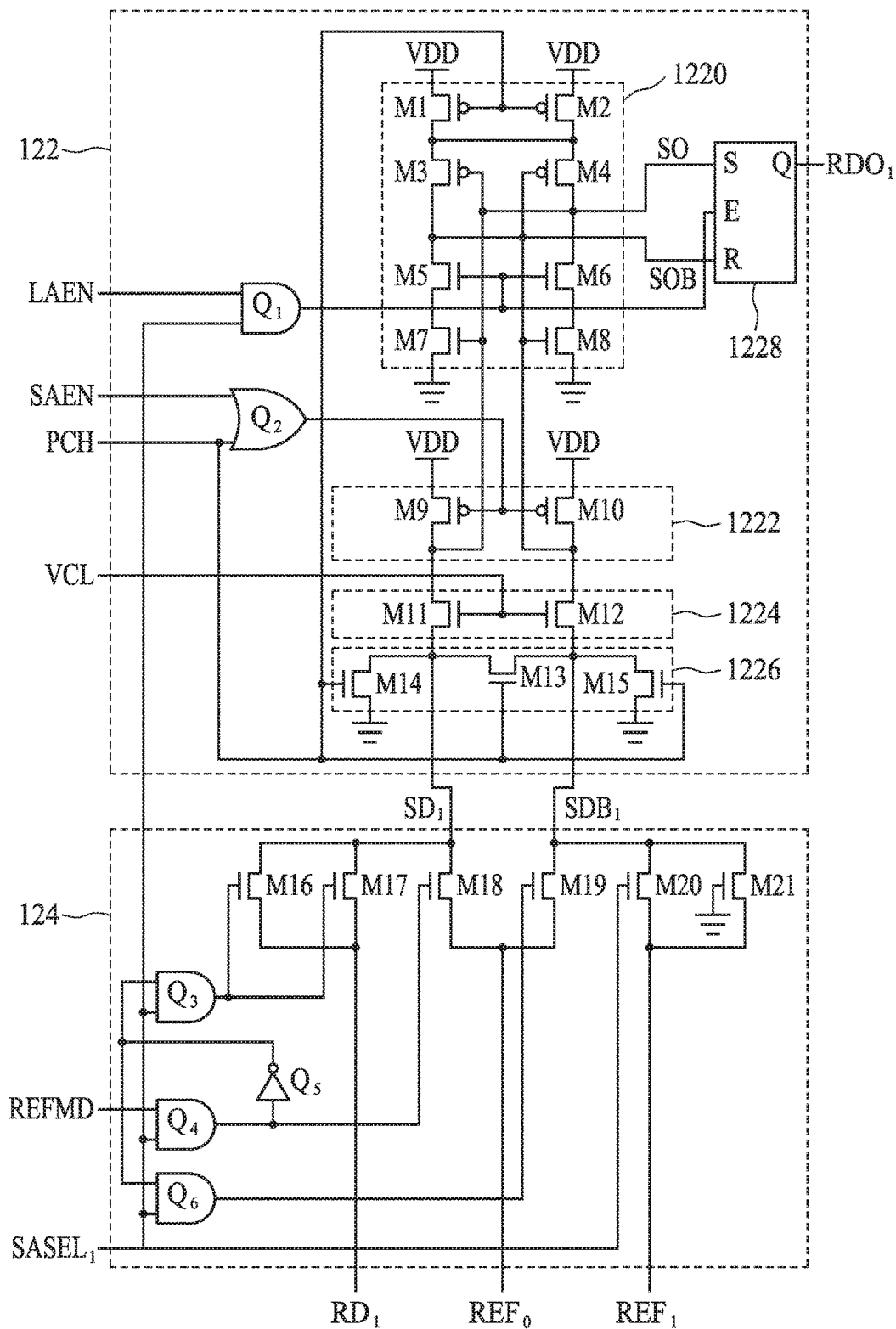
FIG. 7 is a schematic circuit diagram of the current sense amplifier with mode selection in accordance with some embodiments.

FIG. 7 is a schematic circuit diagram illustrating the CSA 12 in FIG. 1, in accordance with some embodiments. For illustration purposes, the CSA 12 is shown. The same structure applies to the CSA 22. The CSA 12 includes the CSA 122 and the mode multiplexer 124. The CSA 122 is a dynamic current sense amplifier that detects instantaneous current difference. The CSA 122 includes a pre-charge device 1226, a clamping device 1224, a pull-up device 1222, a differential amplifier 1220, a latch 1228 and control logic gates $Q_1$ and $Q_2$. The mode multiplexer 124 includes 6 NMOSs M16, M17, M18, M19, M20 and M 21 and control logic gates $Q_3$, $Q_4$, $Q_5$ and $Q_6$.

The mode multiplexer 124 shown in FIG. 7 is an implementation of the mode multiplexer 124 in FIG. 4 and FIG. 5 at the transistor level. The NMOSs M16 and M17 correspond to the switch $S_{121}$, the NMOS M18 corresponds to the switch $S_{122}$, the NMOS M19 corresponds to the switch $S_{123}$, and the NMOSs M20 and M21 correspond to the switch $S_{124}$. Drains and sources of the NMOSs M16 and M17 are coupled to the node $SD_1$ of the CSA 12 and the data output $RD_1$ of the read multiplexer 14 in FIG. 1, respectively. A drain and a source of the NMOS M18 are coupled to the node $SD_1$ and the reference output $REF_0$ of the read multiplexer 14, respectively. A drain and a source of the NMOS M19 are coupled to the node $SDB_1$ and the reference output $REF_0$ of the read multiplexer 14, respectively. Drains and sources of the NMOSs M20 and M21 are coupled to the node $SDB_1$ and the reference output $REF_1$ of the read multiplexer 24 in FIG. 1, respectively. For symmetry purposes, the NMOSs M16, M17 and M18 are coupled to the node $SD_1$, and the NMOSs M19, M20 and M21 are coupled to the node $SDB_1$.

Gates of the NMOSs M16 and M17 are coupled to an output of the control logic gate $Q_3$. A gate of the NMOS M18 is coupled to an output of the control logic gate $Q_4$. A gate of the NMOS M19 is coupled to an output of the control logic gate $Q_6$. A gate of the NMOS M20 is coupled to the sense amplifier select signal $SASEL_1$ and a gate of the NMOS M21 is grounded. The control logic gate $Q_4$ receives the signal $SASEL_1$ and the signal REFMD as inputs. The control logic gates $Q_3$ and $Q_6$ receive the signal $SASEL_1$ as one input, and a complemented output of the control logic gate $Q_4$ through the control logic gate $Q_5$ as the other input. In accordance with some embodiments, the control logic gates $Q_3$, $Q_4$, $Q_5$ and $Q_6$ are two AND gates, an inverter and an AND gate, respectively. Therefore, when the signal $SASEL_1$ is asserted and the signal REFMD is deasserted in the user mode, the NMOSs M16 and M17 couple the data output $RD_1$ of the read multiplexer 14 to the node $SD_1$, the NMOS M19 couples the reference output $REF_0$ of the read multiplexer 14 to the node $SDB_1$, and the NMOS M20 couples the reference output $REF_1$ of the read multiplexer 24 to the node $SDB_1$. In contrast, when the signal $SASEL_1$ is asserted and the signal REFMD is asserted in the reference cell mode, the NMOS M18 couples the reference output $REF_0$ of the read multiplexer 14 to the node $SD_1$, and the NMOS M20 couples the reference output $REF_1$ of the read multiplexer 24 to the node $SDB_1$. When the CSA 22 is selected in the reference cell mode, the signal $SASEL_1$ is deasserted and all of the NMOSs M16 to M21 are turned off.

The pre-charge device 1226 of the CSA 122 is configured to pre-charge both the node $SD_1$ and the node $SDB_1$ to ground VSS in response to the assertion of a pre-charge signal PCH. The pre-charge device 1226 includes two NMOSs M14 and M15 having sources coupled to ground VSS and an NMOS M13 coupling the drains of the two NMOSs M14 and M15 in response to the assertion of the pre-charge signal PCH.

The pull-up device 1222 of the CSA 122 pulls up both the node $SD_1$ and the node $SDB_1$ through the clamping device 1224 when a sense amplifier enable signal SAEN and the pre-charge signal PCH are deasserted. The pull-up device 1222 includes two PMOSs M9 and M10 having sources coupled to a power supply VDD, drains coupled to the node $SD_1$ and the node $SDB_1$ through the clamping device 1224, respectively, gates coupled together and to an output of the control logic gate $Q_2$ receiving the signal SAEN and the signal PCH. In accordance with some embodiments, the control logic gate $Q_2$ is an OR gate.

The clamping device 1224 of the CSA 122 is configured to clamp voltages at the node $SD_1$ and the node $SDB_1$ to a predetermined level that does not overwrite a data bit stored in a memory cell when the pull-up device 1222 is pulling up. In some embodiments, the predetermined level is 0.2V. The clamping device 1224 includes two NMOSs M11 and M12 configured to couple the drains of the PMOSs M9 and M10 of the pull-up device 1222 to the node $SD_1$ and the node $SDB_1$, respectively. Gates of the two NMOSs M11 and M12 are coupled together and to a clamping voltage control signal VCL which controls impedance of the two NMOSs M11 and M12 to provide the desired voltage drop with respect to VDD through the NMOSs M11 and M12.

The differential amplifier 1220 of the CSA 122 is configured to convert difference in currents at the node $SD_1$ and the node $SDB_1$ received through the clamping device 1224 to difference in voltages, and amplify the difference in voltages. The differential amplifier 1220 includes a pair of PMOSs M1 and M2, a pair of PMOSs M3 and M4, a pair of NMOSs M5 and M6, and a pair of NMOSs M7 and M8.

The pair of PMOSs M1 and M2 is configured to provide power supply VDD to the other elements of the differential amplifier 1220 in response to the deassertion of the pre-charge signal PCH. In the pair of PMOSs M1 and M2, sources are coupled to the power supply VDD, drains are coupled together and to both of sources of the pair of PMOSs M3 and M4, and gates are coupled together and to the pre-charge signal PCH.

The pair of PMOSs M3 and M4 is configured to convert difference in currents at the node $SD_1$ and the node $SDB_1$ received through the clamping device 1224 to difference in voltages. In the pair of PMOSs M3 and M4, the sources are coupled to the power supply VDD through the pair of PMOSs M1 and M2, a drain of the PMOS M4 is coupled to a gate of the PMOS M3 and to the node $SD_1$, and a drain of the PMOS M3 is coupled to a gate of the PMOS M4 and to the node $SDB_1$. Therefore, the pair of PMOSs M3 and M4 is cross-coupled. The drains of the pair of PMOSs M3 and M4 serve as differential voltage outputs SO and SOB of the differential amplifier 1220, respectively.

The pair of NMOSs M5 and M6 is configured to couple drains of the pair of NMOSs M7 and M6 to the drains of the pair of PMOSs M3 and M4 in response to the assertion of a latch enable signal LAEN and the assertion of the sense amplifier select signal $SASEL_1$. Gates of the pair of NMOSs M5 are coupled together and to the control logic gate $Q_1$ receiving the latch enable signal LAEN and the sense amplifier select signal $SASEL_1$. In accordance with some embodiments, the control logic gate $Q_1$ is an AND gate.

The pair of NMOSs M7 and M8 forms a cross-coupled inverters with the pair of PMOSs M3 and M4 when the latch enable signal LAEN and the sense amplifier select signal $SASEL_1$ are asserted. The cross-coupled inverters serve to amplify the voltage difference developed at the differential voltage outputs SO and SOB.

The latch 1228 of the CSA 122 is configured to latch the differential voltage outputs SO and SOB when the latch enable signal LAEN and the sense amplifier select signal $SASEL_1$ are asserted. In accordance with some embodiments, the latch 1228 is an SR latch, of which a set input S receives the differential voltage output SO, a reset input R receives the other differential voltage output SOB, an enable input E receives the output of the control logic gate $Q_1$, and a data output Q serves as the output $RDO_1$ of the CSA 12.

Signals for Differential Current Sensing Scheme for MRAM

Figure 8:
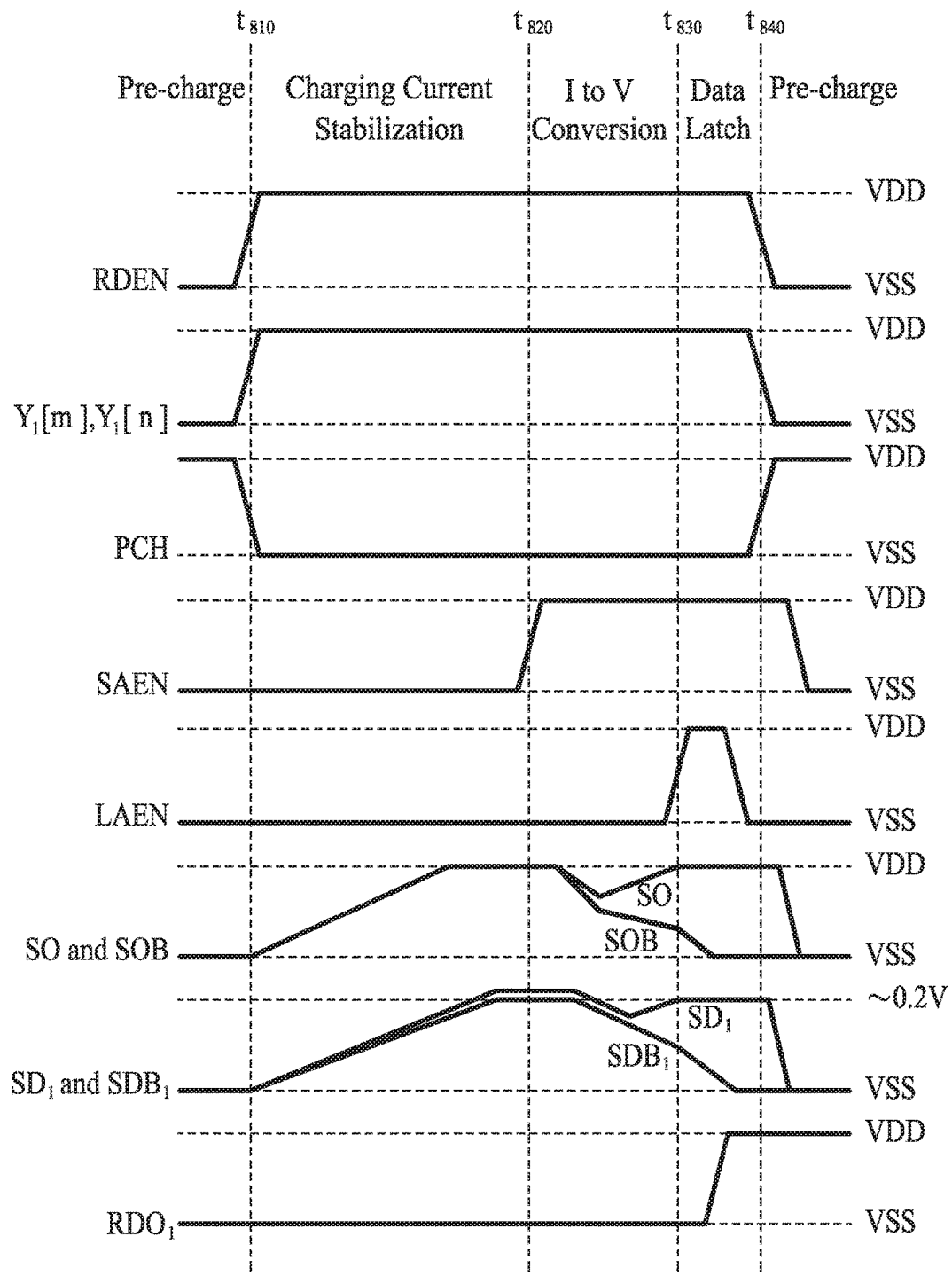
FIG. 8 is a timing diagram of some signals during differential current sensing in accordance with some embodiments.

FIG. 8 is a timing diagram 800 illustrating some signals in FIG. 1 and in FIG. 7 during differential current sensing, in accordance with some embodiments. For illustration purposes, the signals of the CSA 12 are used, and the same timing diagram 800 also applies to the CSA 22. Additionally, the timing diagram 800 also applies to both the user mode and the reference cell mode. During a pre-charge phase before a time $t_{810}$, the pre-charge signal PCH is asserted with a high logical value. The node $SD_1$ and the node $SDB_1$ are pre-charged to ground VSS by the pre-charge device 1226 in FIG. 7. Therefore, both the node $SD_1$ and the node $SDB_1$ start from ground VSS before currents are applied to them.

When the read enable signal RDEN is asserted with a high logical value at the time $t_{810}$, the pre-charge signal PCH is deasserted and a charging current stabilization phase begins. Two columns are selected based on the asserted bits $Y_1[m]$ and $Y_1[n]$ of the column address $Y_1[N:0]$ by the read multiplexer 14 in FIG. 1. Further, the two columns are coupled to the node $SD_1$ and the node $SDB_1$, respectively. The two columns include a regular column and the reference column in the user mode, and include both reference columns in the reference cell mode. The pull-up device 1222 starts charging the node $SD_1$ and the node $SDB_1$ through the clamping device 1224 until currents through the node $SD_1$ and the node $SDB_1$ reach stabilization at a time $t_{820}$. When stabilization is reached, voltages at the two nodes $SD_1$ and $SDB_1$ are at a predetermined clamping voltage of about 0.2V in some embodiments, depending on the clamping voltage control signal VCL to the clamping device 1224. Between time $t_{810}$ and $t_{820}$, the differential amplifier 1220, with the pull-up device 1222, charges the differential voltage outputs SO and SOB. By the time $t_{820}$, the outputs SO and SOB have reached supply voltage VDD.

At the time $t_{820}$, the sense amplifier enable signal SAEN is asserted, and an I to V conversion phase begins. The pull-up device 1222 stops charging the node $SD_1$, the node $SD_2$, and the outputs SO and SOB. The difference in resistance between the two selected columns causes the current to flow through the node $SD_1$ to be smaller than that through the node $SDB_1$. Therefore, the voltage at the node $SD_1$ drops at a rate slower than that of at the node $SDB_1$, which, in turn, causes the voltage at the output SO drops at a rate slower than that of at the output SOB. Because the output SOB drops faster, the PMOS M3 is strongly turned on while the PMOS M4 is weakly turned on. The PMOS M4 pulls the output SO towards VDD while the PMOS M3 slows down the voltage drop at the SOB. Therefore, the difference in voltages at the outputs SO and SOB amplifies. This in turn causes similar transitions at the node $SD_1$ and the node $SDB_1$.

Then, at a time $t_{830}$, the latch enable signal LAEN is asserted and a data latching phase begins. The cross-coupled inverters formed by the PMOSs M3 and M4 and the NMOSs M7 and M8 are in operation. Because the output SO is close to VDD, the PMOS M3 is turned off and the NMOS M7 is turned on and thereby pulling the output SOB to ground VSS. This in turn causes the PMOS M4 to turn on more strongly. The positive feedback of the cross-coupled inverters M3 and M4 further amplifies the difference in voltages at the outputs SO and SOB. Meanwhile, the latch 1228 latches the outputs SO and SOB and generates the output $RDO_1$ of the CSA 12. Then, at a time $t_{840}$, the pre-charge signal PCH is asserted to indicate that the differential current sensing for a read operation is completed.

In some embodiments, a circuit comprises first and second reference cells and a current sense amplifier. The first and second reference cells are configured to store opposite logic values, respectively. The current sense amplifier is configured with a first node and a second node for currents therethrough to be compared with each other. The current sense amplifier comprises a multiplexer configured to couple the first reference cell or the second reference cell to the first node of the current sense amplifier, and couple the second reference cell or the first reference cell to the second node of the current sense amplifier for reading bits stored in the first reference cell and the second reference cell.

In some embodiments, a circuit comprises an array segment, first and second reference columns, and a current sense amplifier. The first and second reference columns are configured to store opposite logic values, respectively. The current sense amplifier is configured with a first node and a second node for currents therethrough to be compared with each other. The current sense amplifier comprises a multiplexer configured to couple one column of the array segment to the first node of the current sense amplifier, and couple the first and second reference columns to the second node of the current sense amplifier for reading data bits stored in a cell in the array segment.

In some embodiments, a method includes: selectively coupling a first reference cell or a second reference cell to a first node of a current sense amplifier; selectively coupling the second reference cell or the first reference cell to a second node of the current sense amplifier; and generating differential voltage outputs based on currents through the first and second nodes of the current sense amplifier for reading bits stored in the first reference cell and the second reference cell.

A number of embodiments of the disclosure have been described. It will nevertheless be understood that various modifications may be made without departing from the spirit and scope of the disclosure. For example, some transistors are shown to be N-type and some others are shown to be P-type, but the disclosure is not limited to such a configuration. Embodiments of the disclosure are applicable in variations and/or combinations of transistor types. A bit line BL or GBL is also called a data line because each of the bit line BL or GBL carries data for a corresponding cell.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A circuit, comprising:
first and second reference cells configured to store opposite logic values, respectively; and
a current sense amplifier, configured with a first node and a second node for currents therethrough to be compared with each other,
wherein the current sense amplifier comprises a multiplexer configured to couple the first reference cell or the second reference cell to the first node of the current sense amplifier, and couple the second reference cell or the first reference cell to the second node of the current sense amplifier for reading bits stored in the first reference cell and the second reference cell.

2. The circuit according to claim 1, further comprising:
a cell segment, comprising a cell;
a plurality of switches, coupled to the first node of the current sense amplifier, and configured to selectively couple the cell of the cell segment to the first node of the current sense amplifier; and
a plurality of loads, coupled to the second node of the current sense amplifier.

3. The circuit according to claim 2, wherein
the plurality of switches further comprise an additional switch;
the additional switch is coupled to the second node of the current sense amplifier, and is configured to selectively couple the first reference cell to the second node of the current sense amplifier;
the plurality of loads further comprise an additional load; and
the additional load is coupled to the first node of the current sense amplifier.

4. The circuit according to claim 2, wherein
for each switch of the plurality of switches, one end of the switch is coupled to the first node of the current sense amplifier, and the other end of the switch is coupled to a source line of the cell of the cell segment corresponding to the switch; and
for each load of the plurality of loads, one end of the load is coupled to the second node of the current sense amplifier, and the other end of the load is coupled to a data line of the cell of the cell segment corresponding to the load or is unconnected.

5. The circuit according to claim 1, wherein the multiplexer of the current sense amplifier comprises:
a first switch configured to disconnect the cell of the cell segment from the first node of the current sense amplifier in a first mode, and couple the cell of the cell segment to the first node of the current sense amplifier in a second mode;
a second switch configured to couple the first reference cell to the first node of the current sense amplifier in the first mode and disconnect the first reference cell from the first node of the current sense amplifier in the second mode;
a third switch configured to disconnect the first reference cell from the second node of the current sense amplifier in the first mode and couple the first reference cell to the second node of the current sense amplifier in the second mode; and
a fourth switch configured to couple the second reference cell to the second node of the current sense amplifier in both the first mode and the second mode.

6. The circuit according to claim 5, wherein
the first switch comprises a first transistor and a second transistor coupled in parallel and both configured to be turned off in the first mode and turned on in the second mode;
the second switch comprises a third transistor configured to be turned on in the first mode and turned off in the second mode;
the third switch comprises a fourth transistor configured to be turned off in the first mode and turned on in the second mode; and
the fourth switch comprises a fifth transistor and a sixth transistor coupled in parallel,
wherein the fifth transistor is configured to be turned on in both the first mode and the second mode; and the sixth transistor is configured to be turned off in both the first mode and the second mode.

7. The circuit according to claim 5, further comprising:
a fifth switch configured to form a common node between the first reference cell and the second reference cell in the first mode, and to disconnect the first reference cell from the second reference cell in the second mode.

8. The circuit according to claim 2, further comprising:
a plurality of dummy cells,
wherein any of the cell segment, the first reference cell and the second reference cell is sandwiched between two of the dummy cells.

9. The circuit according to claim 2, wherein the cell segment and the first reference cell are in the same row.

10. A circuit, comprising:
an array segment;
first and second reference columns configured to store opposite logic values, respectively; and
a current sense amplifier, configured with a first node and a second node for currents therethrough to be compared with each other,
wherein the current sense amplifier comprises a multiplexer configured to couple one column of the array segment to the first node of the current sense amplifier, and couple the first and second reference columns to the second node of the current sense amplifier for reading data bits stored in a cell in the array segment.

11. The circuit according to claim 10, further comprising:
a plurality of switches, coupled to the first node of the current sense amplifier, and configured to selectively couple a column of the array segment to the first node of the current sense amplifier; and
a plurality of loads coupled to the second node of the current sense amplifier.

12. The circuit according to claim 11, wherein
the plurality of switches further comprise an additional switch;
the additional switch is coupled to the second node of the current sense amplifier, and is configured to selectively couple the first reference column to the second node of the current sense amplifier;
the plurality of loads further comprise an additional load; and
the additional load is coupled to the first node of the current sense amplifier.

13. The circuit according to claim 11, wherein
for each switch of the plurality of switches, one end of the switch is coupled to the first node of the current sense amplifier, and the other end of the switch is coupled to a source line of the column of the array segment corresponding to the switch; and
for each load of the plurality of loads, one end of the load is coupled to the second node of the current sense amplifier, and the other end of the load is coupled to a data line of the column of the array segment corresponding to the load or is unconnected.

14. The circuit according to claim 10, wherein the multiplexer of the current sense amplifier comprises:
a first switch configured to disconnect the column of the array segment from the first node of the current sense amplifier in a first mode, and couple the column of the array segment to the first node of the current sense amplifier in a second mode;
a second switch configured to couple the first reference column to the first node of the current sense amplifier in the first mode and disconnect the first reference cell from the first node of the current sense amplifier in the second mode;
a third switch configured to disconnect the first reference column from the second node of the current sense amplifier in the first mode and couple the first reference column to the second node of the current sense amplifier in the second mode; and
a fourth switch configured to couple the second reference column to the second node of the current sense amplifier in both the first mode and the second mode.

15. The circuit according to claim 14, wherein
the first switch comprises a first transistor and a second transistor coupled in parallel and both configured to be turned off in the first mode and turned on in the second mode;
the second switch comprises a third transistor configured to be turned on in the first mode and turned off in the second mode;
the third switch comprises a fourth transistor configured to be turned off in the first mode and turned on in the second mode; and
the fourth switch comprises a fifth transistor and a sixth transistor coupled in parallel,
wherein the fifth transistor is configured to be turned on in both the first mode and the second mode; and the sixth transistor is configured to be turned off in both the first mode and the second mode.

16. The circuit according to claim 14, further comprising:
a fifth switch configured to form a common node between the first reference column and the second reference column in the first mode, and to disconnect the first reference column from the second reference column in the second mode.

17. The circuit according to claim 10, further comprising:
a plurality of dummy columns,
wherein any of the array segment, the first reference column, and the second reference column is sandwiched between two of the dummy columns.

18. A method comprising:
selectively coupling a first reference cell or a second reference cell to a first node of a current sense amplifier;
selectively coupling the second reference cell or the first reference cell to a second node of the current sense amplifier; and
generating differential voltage outputs based on currents through the first and second nodes of the current sense amplifier for reading bits stored in the first reference cell and the second reference cell.

19. The method according to claim 18, further comprising:
selectively coupling a cell of a cell segment to the first node of the current sense amplifier;
selectively coupling first and second reference cells to the second node of the current sense amplifier; and
generating differential voltage outputs based on currents through the first and second nodes of the current sense amplifier for reading data bits stored in the cell in the array segment.

20. The method according to claim 19, wherein
the selectively coupling the first reference cell or the second reference cell to the current sense amplifier comprises:
turning on a first switch coupled between the first node and the first reference cell or the second reference cell in response to a first state of a mode signal; and
turning off a second switch coupled between the first node and the cell of the cell segment in response to the first state of the mode signal; and
the generating the differential voltage outputs based on currents through the first and second nodes of the current sense amplifier comprises:
charging the first node and the second of the current sense amplifier; and
enabling sensing currents through the first and second nodes of the current sense amplifier to generate the differential voltage outputs.

* * * * *